(12) United States Patent
Tanaka

(10) Patent No.: US 10,914,631 B2
(45) Date of Patent: Feb. 9, 2021

(54) ELECTROMAGNETIC WAVE DETECTING APPARATUS AND METHOD OF SETTING ACQUISITION TIMING OF DETECTION SIGNAL

(71) Applicant: PIONEER CORPORATION, Tokyo (JP)

(72) Inventor: Hiroyuki Tanaka, Kawagoe (JP)

(73) Assignee: PIONEER CORPORATION, Tokyo (JP)

(*) Notice: Subject to any disclaimer, the term of this patent is extended or adjusted under 35 U.S.C. 154(b) by 0 days.

(21) Appl. No.: 16/618,192

(22) PCT Filed: May 10, 2018

(86) PCT No.: PCT/JP2018/018136
§ 371 (c)(1),
(2) Date: Nov. 29, 2019

(87) PCT Pub. No.: WO2018/221153
PCT Pub. Date: Dec. 6, 2018

(65) Prior Publication Data
US 2020/0182691 A1 Jun. 11, 2020

(30) Foreign Application Priority Data
Jun. 2, 2017 (JP) .................... 2017-109818

(51) Int. Cl.
*G01J 5/00* (2006.01)
*G01J 1/44* (2006.01)

(52) U.S. Cl.
CPC .......... *G01J 1/44* (2013.01); *G01J 2001/4426* (2013.01); *G01J 2001/4446* (2013.01)

(58) Field of Classification Search
CPC ................. G01J 1/44; G01J 2001/4426; G01J 2001/4446; G01J 1/02
See application file for complete search history.

(56) References Cited

U.S. PATENT DOCUMENTS 5,432,336 A * 7/1995 Carangelo ................. G01J 1/44
 250/214 C
10,007,001 B1 * 6/2018 LaChapelle ............. G01S 7/484
(Continued)

FOREIGN PATENT DOCUMENTS

JP H10148570 A 6/1998
JP H10-311789 A 11/1998
(Continued)

OTHER PUBLICATIONS

International Search Report, dated Jul. 31, 2018, from corresponding PCT application No. PCT/JP2018/018136.

*Primary Examiner* — Kiho Kim
(74) *Attorney, Agent, or Firm* — Nixon & Vanderhye

(57) ABSTRACT

An electromagnetic wave detecting apparatus is provided with: a plurality of detecting devices each of which is configured to detect an electromagnetic wave; a voltage applying device configured to apply bias voltage to each of the plurality of detecting devices; an obtaining device configured to obtain a detection signal outputted from each of the plurality of detecting devices; and a setting device configured to set acquisition timing of the detection signal for each of the plurality of detecting devices, on the basis of the bias voltage, which is applied to each of the plurality of detecting devices, and the detection signal of each of the plurality of detecting devices.

11 Claims, 7 Drawing Sheets

(56) References Cited

U.S. PATENT DOCUMENTS

| | | | |
|---|---|---|---|
| 10,670,745 B1* | 6/2020 | Catarius | G01T 7/005 |
| 2010/0176305 A1* | 7/2010 | Sessler | G01J 5/22 |
| | | | 250/394 |
| 2013/0200250 A1* | 8/2013 | Daghighian | G01J 1/44 |
| | | | 250/206 |
| 2015/0364635 A1* | 12/2015 | Bodlovic | H01L 31/107 |
| | | | 250/214.1 |
| 2016/0209268 A1* | 7/2016 | Lee | G01J 1/44 |
| 2016/0370411 A1* | 12/2016 | Bruwer | G01D 5/24 |
| 2018/0085066 A1* | 3/2018 | Jinnouchi | G01J 1/44 |

FOREIGN PATENT DOCUMENTS

| | | |
|---|---|---|
| JP | H11-64107 A | 3/1999 |
| JP | 2930100 B2 | 8/1999 |
| JP | 2005-338465 A | 12/2005 |
| JP | 2012-515345 A | 7/2012 |
| WO | 2010/083079 A1 | 7/2010 |
| WO | 2017/104020 A1 | 6/2017 |

* cited by examiner

ELECTROMAGNETIC WAVE DETECTING APPARATUS AND METHOD OF SETTING ACQUISITION TIMING OF DETECTION SIGNAL

TECHNICAL FIELD

The present invention relates to an electromagnetic wave detecting apparatus configured to detect an electromagnetic wave, such as, for example, a terahertz wave, and a method of setting acquisition timing of a detection signal on the electromagnetic wave detecting apparatus.

BACKGROUND ART

For this type of apparatus, for example, there is proposed a level adjusting circuit for an infrared sensor, which is configured to selectively supplying bias voltage to each of a plurality of bolometer type thermoelectric conversion elements, which are arranged in a grid, from a constant voltage bias circuit, thereby selectively reading out an electric current that flows in each of the bolometer type thermoelectric conversion elements, and obtaining data about each of the bolometer type thermoelectric conversion elements (refer to Patent Literature 1). The Patent Literature 1 describes that the level adjusting circuit is provided with: a storage configured to store therein a plurality of adjustment value data about the bolometer type thermoelectric conversion elements, which are obtained by previous measurement so as to perform level adjustment on each of the bolometer type thermoelectric conversion elements; a digital control type variable current source configured to supply a level adjustment current, which corresponds to each of the bolometer type thermoelectric conversion elements, on the basis of the adjustment value data stored in the storage; and a device configured to perform addition and subtraction between an electric current, which is selectively read out from each of the bolometer type thermoelectric conversion elements, and the level adjustment current, which is supplied from the digital control type variable current source.

CITATION LIST

Patent Literature

Patent Literature 1: Japanese Patent No. 2930100

SUMMARY OF INVENTION

Technical Problem

A technology/technique described in the Patent Literature 1 requires a switch for selecting the bolometer type thermoelectric conversion element(s) which is to be supplied with the bias voltage, and for example, a circuit configuration is relatively complicated, which is technically problematic. This problem is more evident with increasing number of the bolometer type thermoelectric conversion elements, which are detecting elements.

In view of the aforementioned problem, it is therefore an object of the present invention to provide an electromagnetic wave detecting apparatus configured to appropriately apply bias voltage to each of a plurality of detecting elements while preventing a complicated circuit configuration, as well as a method of setting the acquisition timing of a detection signal.

Solution to Problem

The above object of the present invention can be achieved by an electromagnetic wave detecting apparatus is provided with: a plurality of detecting devices each of which is configured to detect an electromagnetic wave; a voltage applying device configured to apply bias voltage to each of the plurality of detecting devices; an obtaining device configured to obtain a detection signal outputted from each of the plurality of detecting devices; and a setting device configured to set acquisition timing of the detection signal for each of the plurality of detecting devices, on the basis of the bias voltage, which is applied to each of the plurality of detecting devices, and the detection signal of each of the plurality of detecting devices.

The above object of the present invention can be achieved by a method of setting acquisition timing of a detection signal in an electromagnetic wave detecting apparatus including: a plurality of detecting devices each of which is configured to detect an electromagnetic wave; a voltage applying device configured to apply bias voltage to each of the plurality of detecting devices; and an obtaining device configured to obtain a detection signal outputted from each of the plurality of detecting devices, the method provided with: a setting process of setting the acquisition timing of the detection signal for each of the plurality of detecting devices, on the basis of the bias voltage, which is applied to each of the plurality of detecting devices, and the detection signal of each of the plurality of detecting devices.

The effect of the present invention and other benefits will become apparent from the following description of embodiments.

DESCRIPTION OF EMBODIMENTS

Figure 1:
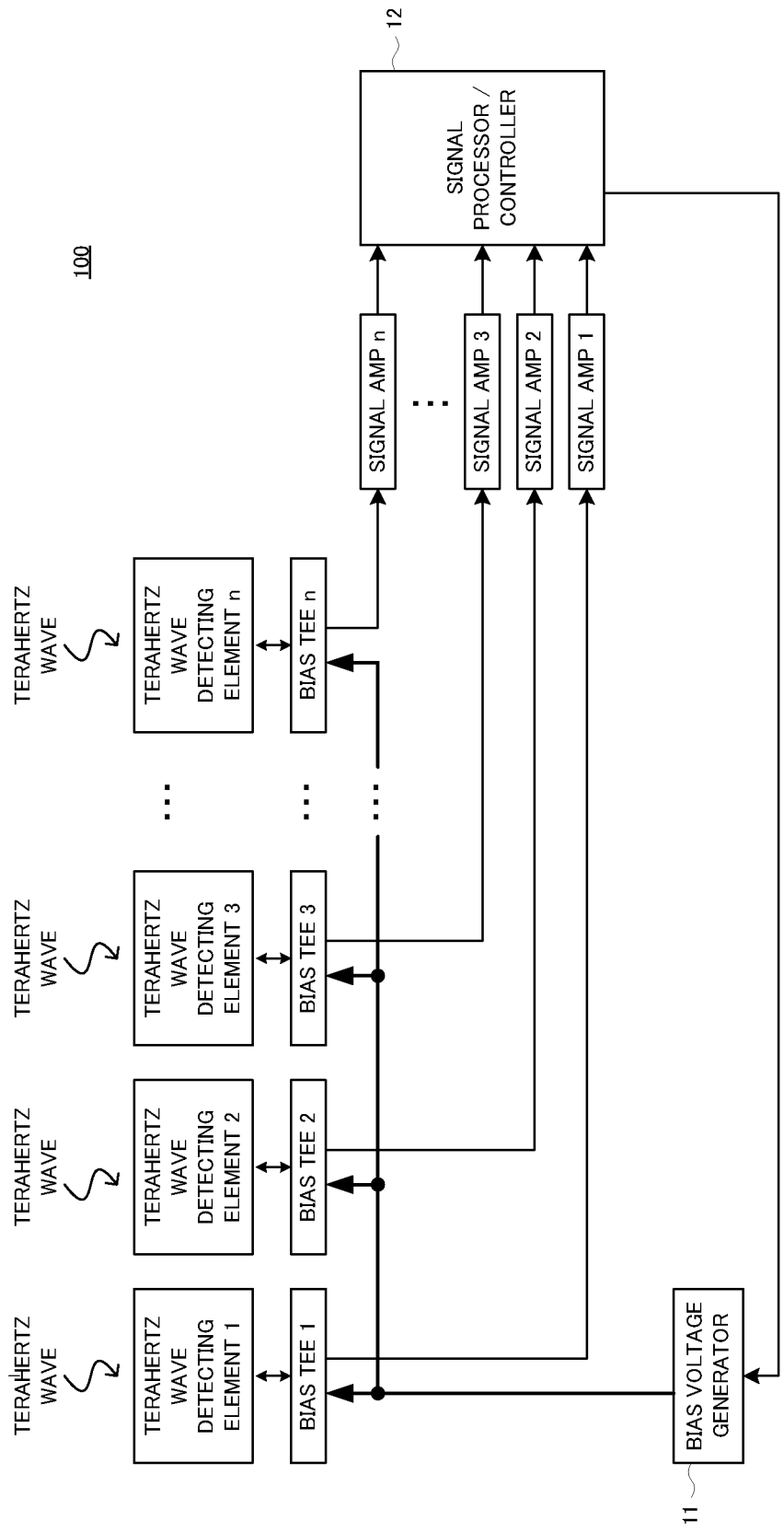
FIG. 1 is a block diagram illustrating a configuration of a terahertz wave detecting apparatus according to a first practical example.

An electromagnetic wave detecting apparatus of the present invention, etc. will be explained.

(Electromagnetic Wave Detecting Apparatus)

An electromagnetic wave detecting apparatus according to an embodiment is provided with: a plurality of detecting devices each of which is configured to detect an electromagnetic wave; a voltage applying device configured to apply bias voltage to each of the plurality of detecting devices; an obtaining device configured to obtain a detection signal outputted from each of the plurality of detecting devices; and a setting device configured to set acquisition timing of the detection signal for each of the plurality of detecting devices, on the basis of the bias voltage, which is applied to each of the plurality of detecting devices, and the detection signal of each of the plurality of detecting devices.

There is variation in the detecting devices to a greater or lesser extent, and optimum bias voltage to be applied may be different for each of the detecting devices in many cases. If a circuit between the voltage applying device and each of the detecting devices is configured in such a manner that the optimum bias voltage is applied to each of the detecting devices, then, a circuit configuration may be complicated when the number of the detecting devices including the detecting elements increases. Thus, on the electromagnetic wave detecting apparatus, the acquisition timing is set so that the detecting signal is obtained, for example, in timing of application of the optimum bias voltage to each of the detecting devices. In other words, on the electromagnetic wave detecting apparatus, a complicated circuit configuration is prevented by devising the acquisition timing of the detection signal.

In an aspect of the electromagnetic wave detecting apparatus according to the embodiment, the voltage applying device is a single voltage applying device, and the plurality of detecting devices are connected to the voltage applying device electrically in parallel to each other. Alternatively, in another aspect of the electromagnetic wave detecting apparatus according to the embodiment, the voltage applying device is configured to apply the bias voltage in a first period, to each of detecting devices in a first group, out of the plurality of detecting devices, and is configured to apply the bias voltage in a second period, which is different from the first period, to each of detecting devices in a second group, which is different from the first group, out of said plurality of detecting devices. According to these aspects, the bias voltage can be applied to the plurality of detecting devices from one voltage applying device. As a result, it is possible to provide a relatively simple circuit configuration between the voltage applying device and each of the detecting devices.

In another aspect of the electromagnetic wave detecting apparatus according to the embodiment, the voltage applying device is configured to periodically change a voltage value of the bias voltage. According to this aspect, for example, the optimum bias voltage can be periodically applied to each of the detecting devices, relatively easily. In this aspect, the setting device may set the acquisition timing of the detection signal for each of the plurality of detecting devices, within one period of the voltage value, which is periodically changed.

In another aspect of the electromagnetic wave detecting apparatus according to the embodiment, the voltage applying device is configured to periodically switch between on and off of the bias voltage, and the voltage applying device is configured to sequentially increase a voltage value of the bias voltage within a range from a first voltage to a second voltage, which is higher than the first voltage, every time the bias voltage is switched from off to on, and is configured to switch the bias voltage from on to off when the voltage value reaches the second voltage, and is configured to set the voltage value at the first voltage next time the bias voltage is switched from off to on. According to this aspect, for example, the optimum bias voltage can be periodically applied to each of the detecting devices, relatively easily.

In another aspect of the electromagnetic wave detecting apparatus according to the embodiment, the acquisition timing of the detection signal is a time at which a bias voltage that allows a maximum detection sensitivity, or a bias voltage that is lower by a predetermined voltage than the bias voltage that allows the maximum detection sensitivity, is applied to a corresponding detecting device. According to this aspect, it is possible to relatively sensitively detect the electromagnetic wave on each of the detecting devices.

In another aspect of the electromagnetic wave detecting apparatus according to the embodiment, it is provided with a storing device configured to store the acquisition timing of the detection signal for each of the plurality of detecting devices. According to this aspect, it is beneficial in practice.

In another aspect of the electromagnetic wave detecting apparatus according to the embodiment, each of the plurality of detecting devices includes an element having nonlinearity in current-voltage characteristics. In this aspect, the element may be a resonant tunneling diode. By virtue of such a configuration, it is possible to detect a terahertz wave.

(Method of Setting Acquisition Timing of Detection Signal)

A method of setting acquisition timing of a detection signal according to an embodiment is a method of setting acquisition timing of a detection signal in an electromagnetic wave detecting apparatus including: a plurality of detecting devices each of which is configured to detect an electromagnetic wave; a voltage applying device configured to apply bias voltage to each of the plurality of detecting devices; and an obtaining device configured to obtain a detection signal outputted from each of the plurality of detecting devices. The method is provided with: a setting process of setting the acquisition timing of the detection signal for each of the plurality of detecting devices, on the basis of the bias voltage, which is applied to each of the plurality of detecting devices, and the detection signal of each of the plurality of detecting devices. By setting the acquisition timing of the detection signal in this manner, it is possible to prevent a complicated circuit configuration of the electromagnetic wave detecting apparatus.

PRACTICAL EXAMPLES

An electromagnetic wave detecting apparatus according to practical examples of the present invention will be explained with reference to the drawings. In the practical examples below, a "terahertz wave" is exemplified as the "electromagnetic wave" according to the present invention.

First Practical Example

A terahertz wave detecting apparatus according to a first practical example, which is an example of the electromagnetic wave detecting apparatus according to the present invention, will be explained with reference to FIG. 1 to FIG. 3.

(Configuration of Apparatus)

A configuration of the terahertz wave detecting apparatus according to the first practical example will be explained with reference to FIG. 1. FIG. 1 is a block diagram illustrating the configuration of the terahertz wave detecting apparatus according to the first practical example.

In FIG. 1, a terahertz wave detecting apparatus 100 is provided with: a plurality of terahertz wave detecting elements 1, 2, 3, . . . , n; a plurality of bias tee circuits 1, 2, 3, ..., n, which are respectively electrically connected to the terahertz wave detecting elements 1, 2, 3, ..., n; a bias voltage generator 11 configured to apply bias voltage to each of the terahertz wave detecting elements 1, 2, 3, ..., n, via respective one of the bias tee circuits 1, 2, 3, ..., n; a plurality of signal amplifiers 1, 2, 3, ..., n, each of which is configured to amplify a signal outputted from respective one of the terahertz wave detecting elements 1, 2, 3, ..., n; and a signal processor/controller 12 configured to sample (or obtain) a signal outputted from each of the signal amplifiers 1, 2, 3, ..., n, and configured to control the bias voltage generator 11.

Each of the terahertz wave detecting elements 1, 2, 3, ..., n is an element having nonlinearity in current-voltage characteristics, such as, for example, a resonant tunneling diode (RTD). The terahertz wave detecting elements 1, 2, 3, ..., n are arranged in an array.

A terahertz wave from a not-illustrated terahertz wave generator enters each of the terahertz wave detecting elements 1, 2, 3, ..., n. Here, the terahertz wave from the terahertz wave generator is modulated with a certain period. The terahertz wave from the terahertz wave generator is modulated, for example, in such a manner that a terahertz wave generating period and a terahertz wave non-generating period are alternately repeated with a certain period.

When the terahertz wave enters each of the terahertz wave detecting elements, an electrical signal corresponding to the intensity of the incident terahertz wave is outputted from each of the terahertz wave detecting elements. The electrical signal outputted from each of the terahertz wave detecting elements includes an alternating current component. Each of the bias tee circuits is configured to extract the alternating current component of the electrical signal outputted from the corresponding terahertz wave detecting element, and is configured to output it to the corresponding signal amplifier as a detection signal.

The signal processor/controller 12 is configured to sample a detection signal that is amplified by each of the signal amplifiers, and is configured to detect signal amplitude of the detection signal, thereby detecting the intensity of the terahertz wave. Here, for example, lock-in detection may be used to detect the signal amplitude. A detailed explanation of the detection of the intensity of the terahertz wave will be omitted because the existing technologies/techniques can be applied.

(Bias Voltage)

As illustrated in FIG. 1, on the terahertz wave detecting apparatus 100, the bias voltage is applied to each of the terahertz wave detecting elements by one signal line from the single bias voltage generator 11. Meanwhile, there is variation in the terahertz wave detecting elements 1, 2, 3, ..., n, to a greater or lesser extent, and the optimum bias voltage may be different for each of them in many cases. If the optimum bias voltage for each of the terahertz wave detecting elements is not applied, it is hard to stably operate each of terahertz wave detecting elements. Thus, on the terahertz wave detecting apparatus 100, the bias voltage whose voltage value changes with time, such as, for example, a sawtooth wave, is outputted from the bias voltage generator 11.

The bias voltage according to the first practical example will be explained with reference to FIG. 2. FIG. 2 is a diagram illustrating an example of each of a waveform of bias voltage and waveforms of signals from terahertz wave detecting elements. In the example illustrated in FIG. 2, it is assumed that the terahertz wave with a certain intensity enters each of the terahertz wave detecting elements.

In the first practical example, a time required (or allowed) for the signal processor/controller 12 to read out the detection signal from one terahertz wave detecting element is set as one period (refer to "ELEMENT 1 READ-OUT PERIOD" and the like in FIG. 2), and the bias voltage that changes in stages from a voltage Vfirst to a voltage Vlast is applied to each of the terahertz wave detecting elements 1, 2, 3, ..., n. FIG. 2 illustrates emphasized notches of the bias voltage so as to clearly show a stepwise change in the bias voltage.

If the bias voltage of this type is applied to each of the terahertz wave detecting elements, the sensitivity of detection of each of the terahertz wave detecting elements changes in accordance with the voltage value of the bias voltage (which results in a change in signal level of the detection signal). The signal processor/controller 12 may sample the detection signal in timing of application of the optimum bias voltage to each of the terahertz wave detecting elements, during the read-out period of each of the terahertz wave detecting elements 1, 2, 3, ..., n.

Figure 2:
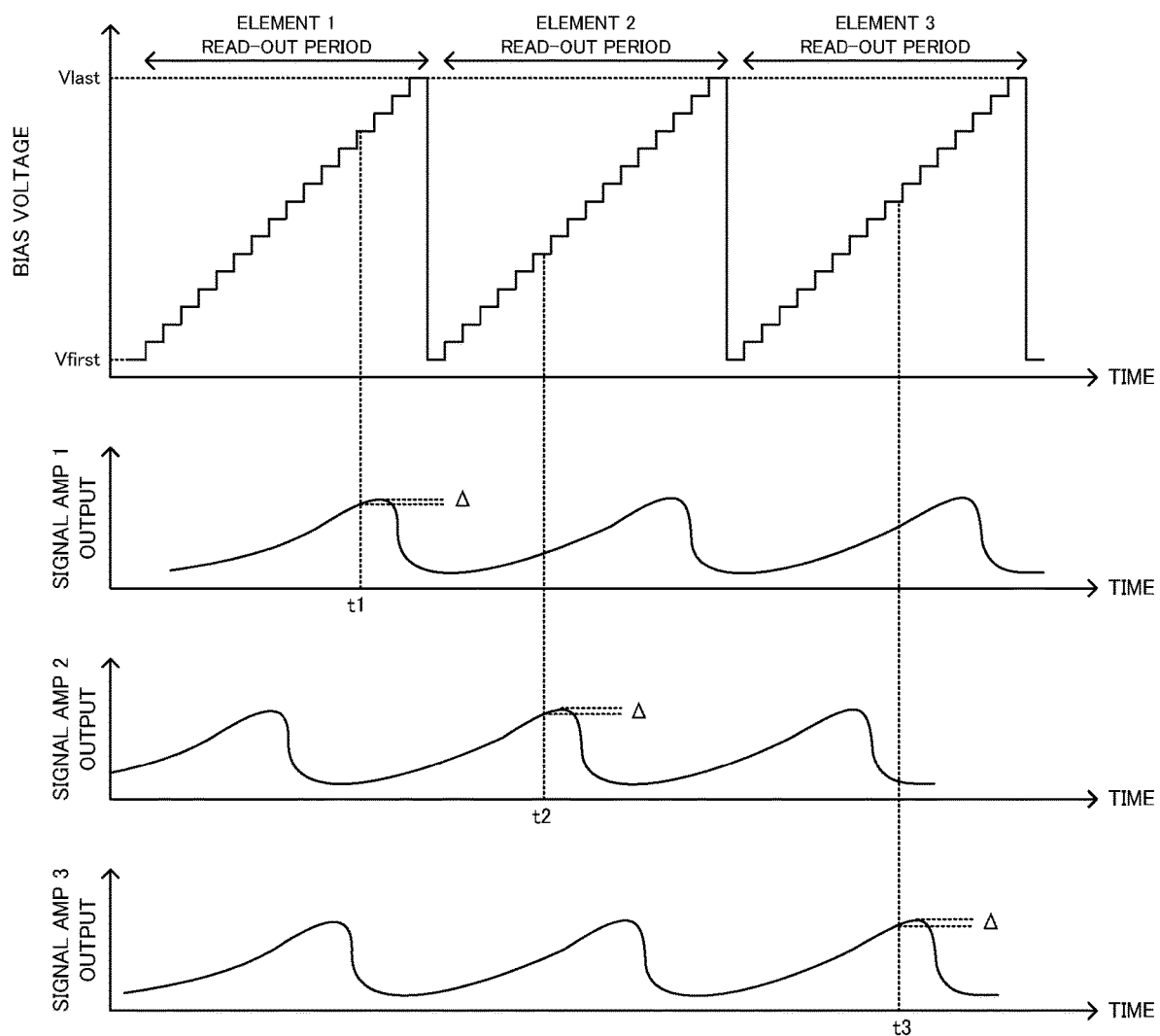
FIG. 2 is a diagram illustrating an example of each of a waveform of bias voltage and waveforms of signals from terahertz wave detecting elements according to the first practical example.

For example, the signal processor/controller 12 may sample the detection signal (i.e., a signal amplifier 1 output) at a time point t1 in the element 1 read-out period in FIG. 2, may sample the detection signal (i.e., a signal amplifier 2 output) at a time point t2 in an element 2 read-out period, and may sample the detection signal (i.e., a signal amplifier 3 output) at a time point t3 in an element 3 read-out period.

(Setting of Sampling Timing)

The timing of sampling the detection signal from each of the terahertz wave detecting elements is set in advance and stored, for example, in a memory or the like of the signal processor/controller 12. A process of setting the sampling timing according to the first practical example will be explained with reference to a flowchart in FIG. 3. The process of setting the sampling timing is an example of the "method of setting the "detection signal acquisition timing" according to the present invention.

In the first practical example, the "optimum bias voltage" is a voltage that is lower by a predetermined voltage than the bias voltage that allows a maximum detection sensitivity of each of the terahertz wave detecting elements. In a non-linear area of the current-voltage characteristics, with increasing bias voltage that is applied to each of the terahertz wave detecting elements, the detection sensitivity also increases, but if the bias voltage exceeds a voltage value that allows the maximum detection sensitivity, the detection sensitivity is rapidly lost. The bias voltage that allows the maximum detection sensitivity can be set as the optimum bias voltage; however, if, for example, a temperature change or the like causes a fluctuation in the bias voltage or a change in the characteristics of the terahertz wave detecting elements, then, there is a possibility that an expected detection sensitivity cannot be obtained. Thus, the stability of the operation of the terahertz wave detecting apparatus 1 is ensured by setting the voltage that is lower by the predetermined voltage than the bias voltage that allows the maximum detection sensitivity as the optimum bias voltage, as described above.

Figure 3:
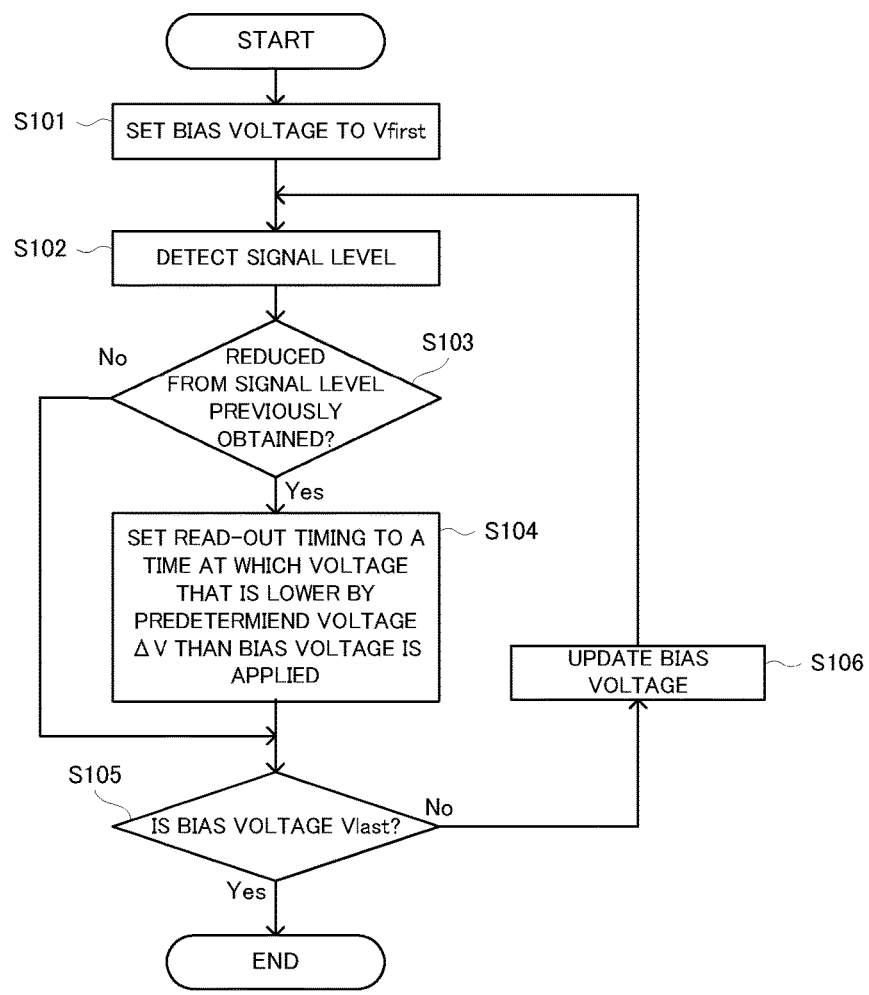
FIG. 3 is a flowchart illustrating a process of setting sampling timing according to the first practical example.

In FIG. 3, the signal processor/controller 12 sets the bias voltage to the voltage Vfirst and controls the bias voltage generator 11 to output the voltage Vfirst (step S101). The signal processor/controller 12 then detects the signal level of the detection signal of the terahertz wave detecting element that is a target of setting the sampling timing (step S102). When the process of setting the sampling timing illustrated in FIG. 3 is performed, the terahertz wave with a certain intensity enters each of the terahertz wave detecting elements.

The signal processor/controller 12 then determines whether or not the signal level currently detected in the step S102 is lower than the signal level previously detected in the step S102 (step S103). In this determination, if it is determined that the currently detected signal level is not lower than the previously detected signal level (the step S103: No), a step S105 described later is performed.

On the other hand, in the determination in the step S103, if it is determined that the currently detected signal level is lower than the previously detected signal level (the step S103: Yes), the signal processor/controller 12 sets the sampling timing to a time at which a voltage that is lower by a small voltage ΔV than a current bias voltage V is applied to the terahertz wave detecting element that is a target of setting the sampling timing (step S104). It is because "the currently detected signal level is lower than the previously detected signal level" means that the bias voltage exceeds the voltage value that allows the maximum detection sensitivity of the terahertz wave detecting element.

The signal processor/controller 12 then determines whether or not the current bias voltage V is the voltage Vlast (step S105). In this determination, if it is determined that the current bias voltage V is not the voltage Vlast (the step S105: No), the signal processor/controller 12 sets a voltage that is obtained by adding the small voltage ΔV to the current bias voltage V, as a new bias voltage (step S106), and performs the process after the step S102.

On the other hand, in the determination in the step S105, if it is determined that the current bias voltage V is the voltage Vlast (the step S105: Yes), the process of setting the sampling timing illustrated in FIG. 3 is ended. The signal processor/controller 12 performs the process of setting the sampling timing illustrated in FIG. 3 for all the terahertz wave detecting elements 1, 2, 3, . . . , n, and sets the sampling timing for each of the terahertz wave detecting elements 1, 2, 3, . . . , n.

The process of setting the sampling timing illustrated in FIG. 3 may be performed once before the terahertz wave is measured by the terahertz wave detecting apparatus 100. If the process of setting the sampling timing illustrated in FIG. 3 is performed, regularly or irregularly, even during the measurement of the terahertz wave, then, it is possible to suppress an influence of an environmental change, such as, for example, a temperature change, during the measurement of the terahertz wave.

(Technical Effect)

On the terahertz wave detecting apparatus 100, as illustrated in FIG. 1, the bias voltage is applied to each of the terahertz wave detecting elements 1, 2, 3, . . . , n by one signal line from the single bias voltage generator 11. It is thus possible to prevent a circuit configuration from being complicated even when the number of the terahertz wave detecting elements increases.

In addition, the bias voltage with the voltage waveform as illustrated in FIG. 2 is applied to each of the terahertz wave detecting elements 1, 2, 3, . . . , n, and the detection signal is sampled in the timing set by the process of setting the sampling timing illustrated in FIG. 3. It is thus possible to sample the detection signal in the timing of application of the optimum bias voltage to each of the terahertz wave detecting elements. In other words, it is possible to sample the detection signal by applying the optimum bias voltage to each of the terahertz wave detecting elements 1, 2, 3, . . . , n.

The "terahertz wave detecting element" and the "bias voltage generator 11" according to the first practical example are respectively an example of the "detecting device" and the "voltage applying device" according to the present invention. The "signal processor/controller 12" according to the first practical example is an example of the "obtaining device", the "setting device", and the "storing device" according to the present invention.

MODIFIED EXAMPLE

Figure 4:
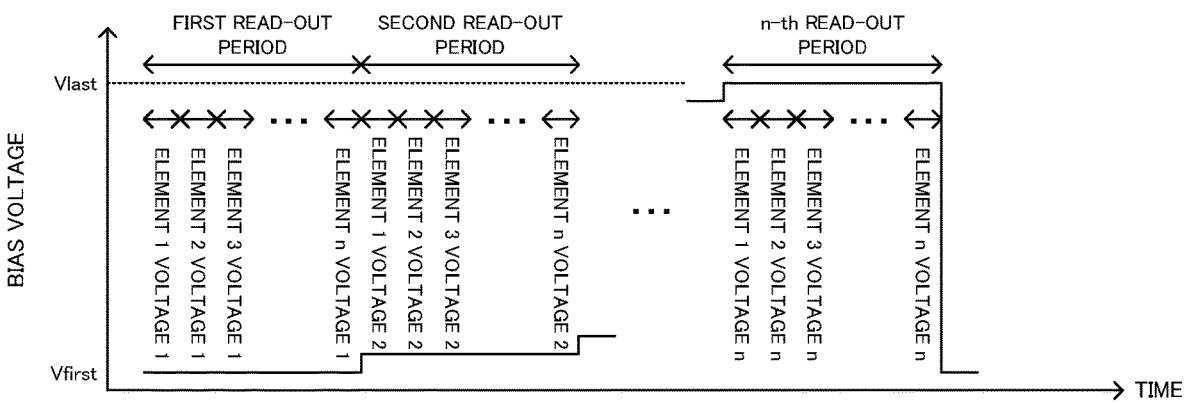
FIG. 4 is a diagram illustrating a method of applying the bias voltage according to a modified example of the first practical example.

In the aforementioned first practical example, as illustrated in FIG. 2, the terahertz wave detecting element that is a sampling target is changed in every period of the sawtooth wave of the bias voltage. For example, as illustrated in FIG. 4, every time the voltage value of the bias voltage is changed, all the terahertz wave detecting elements 1, 2, 3, . . . , n may be set as sampling targets, and the detection signal from the terahertz wave detecting element whose current bias voltage is the optimum bias voltage may be actually sampled.

Moreover, in the aforementioned first practical example, the voltage that is lower by the predetermined voltage than the bias voltage that allows the maximum detection sensitivity of each terahertz wave detecting element is set as the "optimum bias voltage". The bias voltage that allows the maximum detection sensitivity of each terahertz wave detecting element may be also set as the "optimum bias voltage".

Moreover, the bias voltage may be applied to a terahertz wave detecting element in such a manner that the signal level of the detection signal of this terahertz wave detecting element matches the signal level of the detection signal that is outputted when the aforementioned optimum bias voltage (i.e., the voltage that is lower by the predetermined voltage than the bias voltage that allows the maximum detection sensitivity, or the bias voltage that allows the maximum detection sensitivity) is applied to a terahertz wave detecting element with the minimum detection sensitivity.

Second Practical Example

A terahertz wave detecting apparatus according to a second practical example, which is an example of the electromagnetic wave detecting apparatus according to the present invention, will be explained with reference to FIG. 5 and FIG. 6. The second practical example is the same as the aforementioned first practical example, except that the circuit configuration is partially different. Thus, in the second practical example, the same explanation as that in the first practical example will be omitted, as occasion demands, and the same parts on the drawings will carry the same reference numerals. An explanation will be given only to basically different points with reference to FIG. 5 and FIG. 6.

(Configuration of Apparatus)

A configuration of the terahertz wave detecting apparatus according to the second practical example will be explained with reference to FIG. 5. FIG. 5 is a block diagram illustrating the configuration of the terahertz wave detecting apparatus according to the second practical example.

Figure 5:
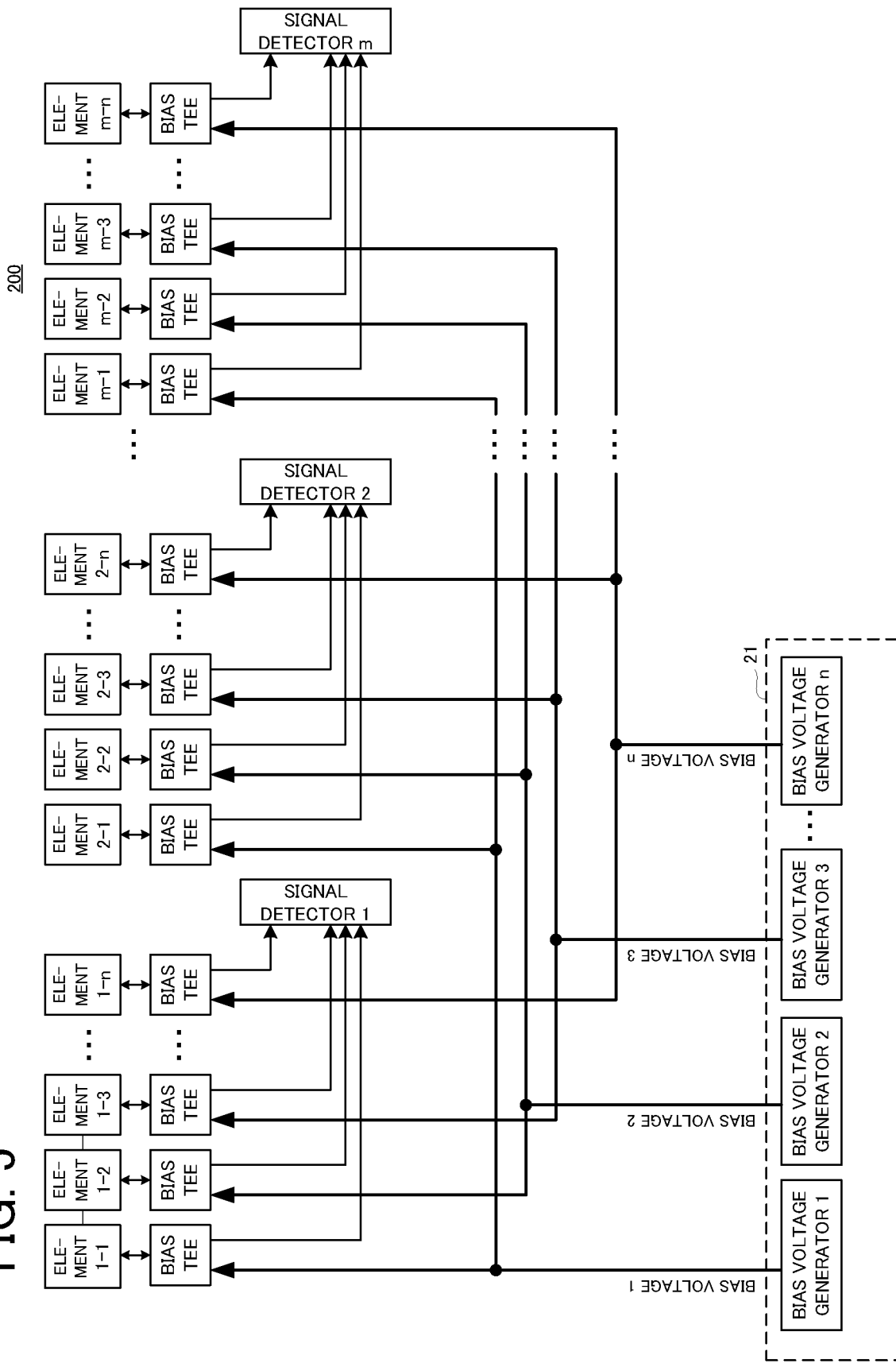
FIG. 5 is a block diagram illustrating a configuration of a terahertz wave detecting apparatus according to a second practical example.
Figure 6:
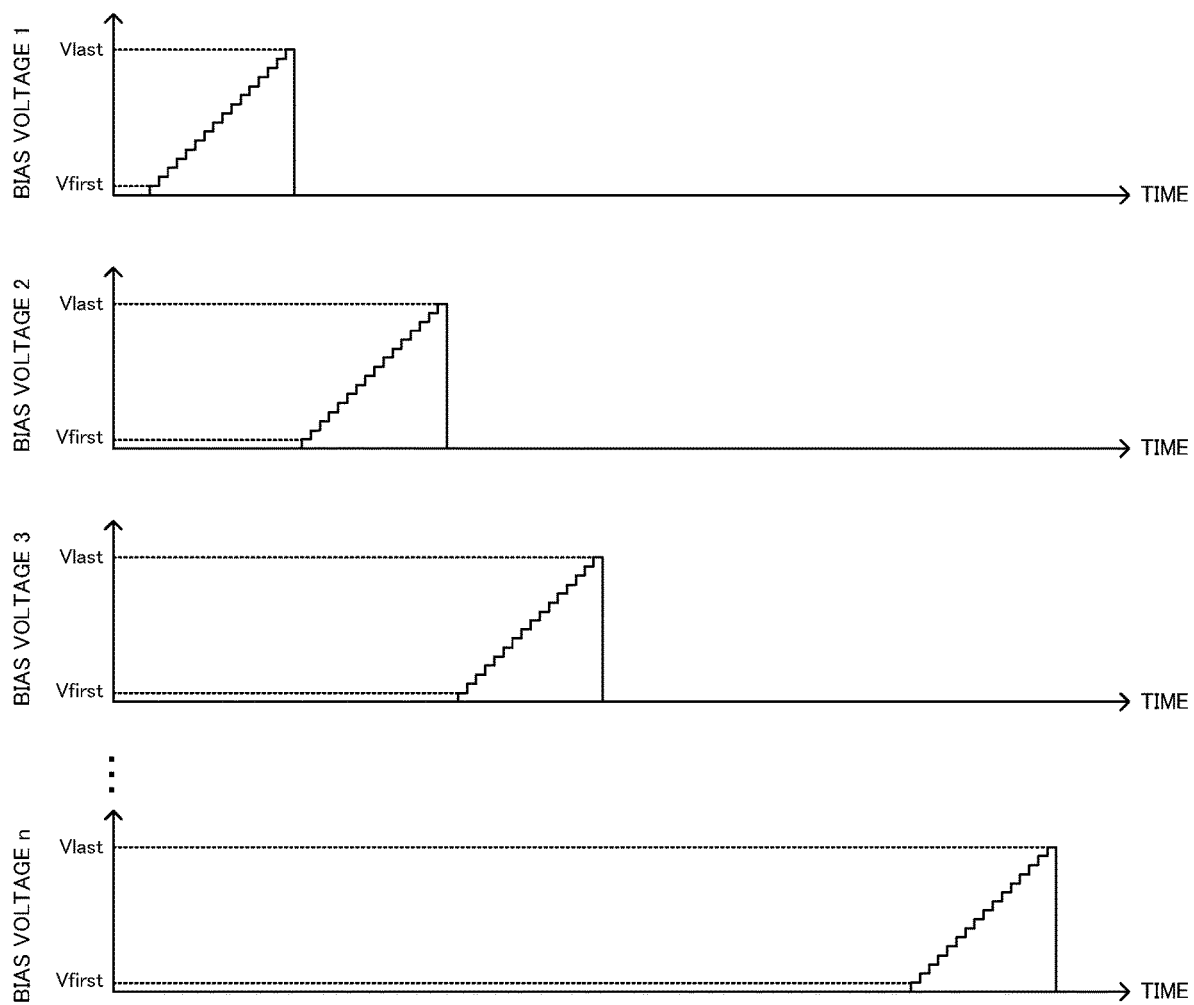
FIG. 6 is a diagram illustrating a method of applying the bias voltage according to the second practical example.

In FIG. 5, a terahertz wave detecting apparatus 200 is provided with: a plurality of terahertz wave detecting elements 1-1, . . . , 1-n, 2-1, . . . , 2-n, . . . , m-1, . . . , m-n; a plurality of bias tee circuits, which are respectively electrically connected to the terahertz wave detecting elements 1-1, . . . , 1-n, 2-1, . . . , 2-n, . . . , m-1, . . . , m-n; a bias voltage generation unit 21 configured to apply bias voltage to each of the terahertz wave detecting elements 1-1, ..., 1-*n*, 2-1, ..., 2-*n*, ..., *m*-1, ..., *m*-*n*, via respective one of the bias tee circuits; and a plurality of signal detectors 1, 2, ..., *m*, which are configured to detect signals respectively outputted from the terahertz wave detecting elements 1-1, ..., 1-*n*, 2-1, ..., 2-*n*, ..., *m*-1, ..., *m*-*n*. The signal detectors 1, 2, ..., and *m* corresponds to the signal processor/controller 12 according to the first practical example.

The bias voltage generation unit 21 includes a plurality of bias voltage generators 1, 2, ..., *n*. Each of the bias voltage generators 1, 2, ..., *n* is configured to apply the bias voltage to a corresponding group of terahertz wave detecting elements. For example, the "bias voltage generator 1" in FIG. 5 is configured to apply the bias voltage to a group of terahertz wave detecting elements including the "element 1-1", the "element 2-1", ..., and the "element *m*-1". Each of the signal detectors 1, 2, ..., *m* is configured to sample detection signals from the electrically connected terahertz wave detecting elements electrically connected thereto.

(Bias Voltage)

Next, the bias voltage according to the second practical example will be explained with reference to FIG. 6. FIG. 6 is a diagram illustrating an example of a waveform of the bias voltage according to the second practical example. On the terahertz wave detecting apparatus 200, as illustrated in FIG. 6, the bias voltage whose voltage value changes with time, such as, for example, a sawtooth wave, is outputted from each of the bias voltage generators. Particularly in the second practical example, in a period in which the bias voltage is outputted from one bias voltage generator, the bias voltage is not outputted from the other bias voltage generators. In other words, in the second practical example, the bias voltage is not applied to all the terahertz wave detecting elements 1-1, ..., 1-*n*, 2-1, ..., 2-*n*, ..., *m*-1, ..., *m*-*n* at the same time.

Thus, each of the signal detectors 1, 2, ..., *m* does not set two or more terahertz wave detecting elements as the sampling target at the same time. Each of the signal detectors 1, 2, ..., *m* sets one terahertz wave detecting element to which the bias voltage is applied, as the sampling target. For example, the "signal detector 1" in FIG. 5 sets the "element 1-1" as the sampling target in a period in which the bias voltage is outputted from the "bias voltage generator 1", sets the "element 1-2" as the sampling target in a period in which the bias voltage is outputted from the "bias voltage generator 2", ..., and sets the "element 1-*n*" as the sampling target in a period in which the bias voltage is outputted from the "bias voltage generator n".

(Technical Effect)

According to the terahertz wave detecting apparatus 200, particularly in comparison with when the bias voltage is applied to all the terahertz wave detecting elements 1-1, ..., 1-*n*, 2-1, ..., 2-*n*, ..., *m*-1, ..., *m*-*n* all the time, it is possible to reduce consumption current of the terahertz wave detecting apparatus 200, significantly (to 1/n herein).

First Modified Example

Figure 7:
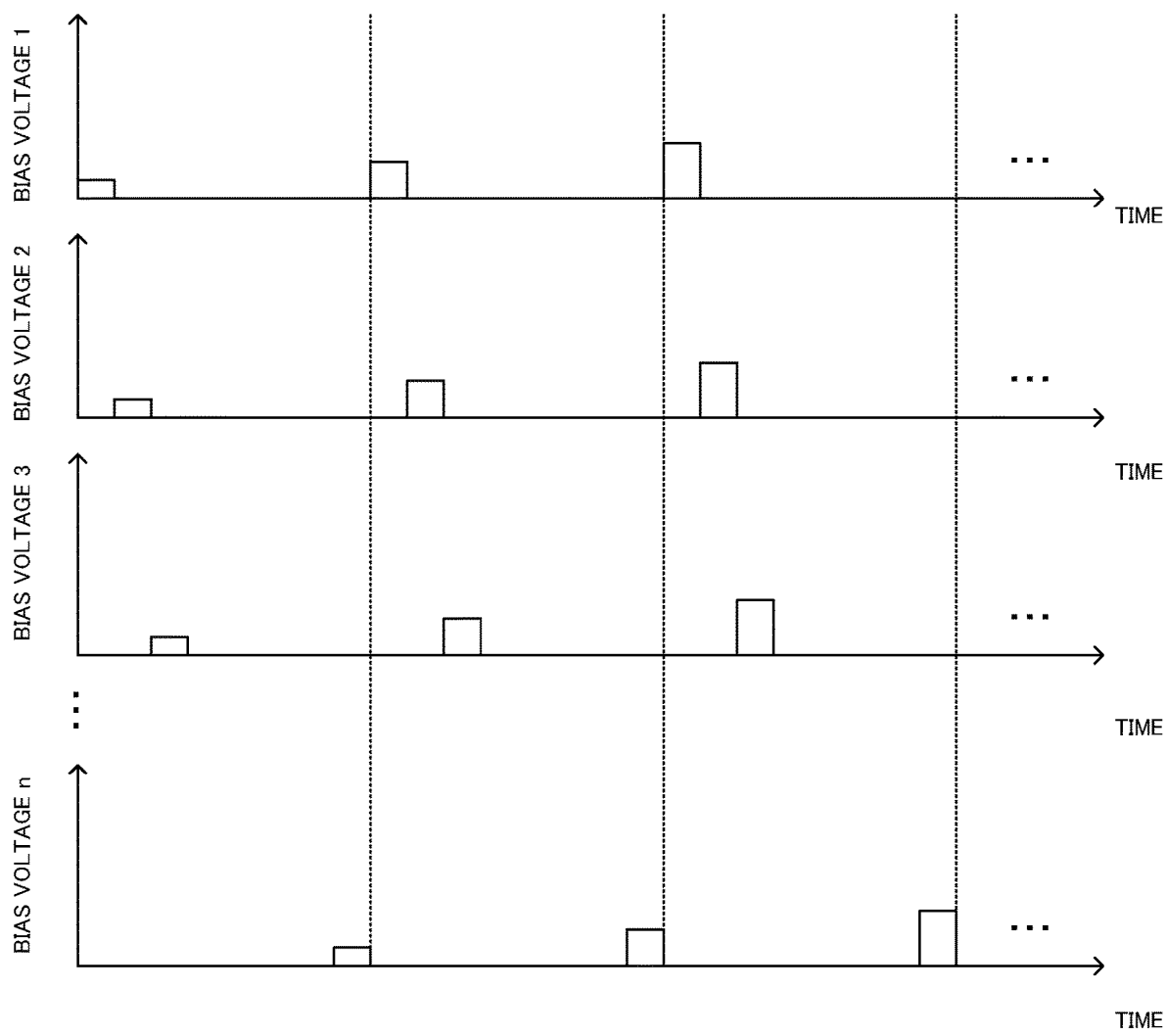
FIG. 7 is a diagram illustrating a method of applying the bias voltage according to a first modified example of the second practical example.

If the bias voltage is not outputted from two or more bias voltage generators at the same time, for example, as illustrated in FIG. 7, a possible aspect may be that the voltage value of the bias voltage is changed every time on/off of the bias voltage is switched.

Second Modified Example

Figure 8:
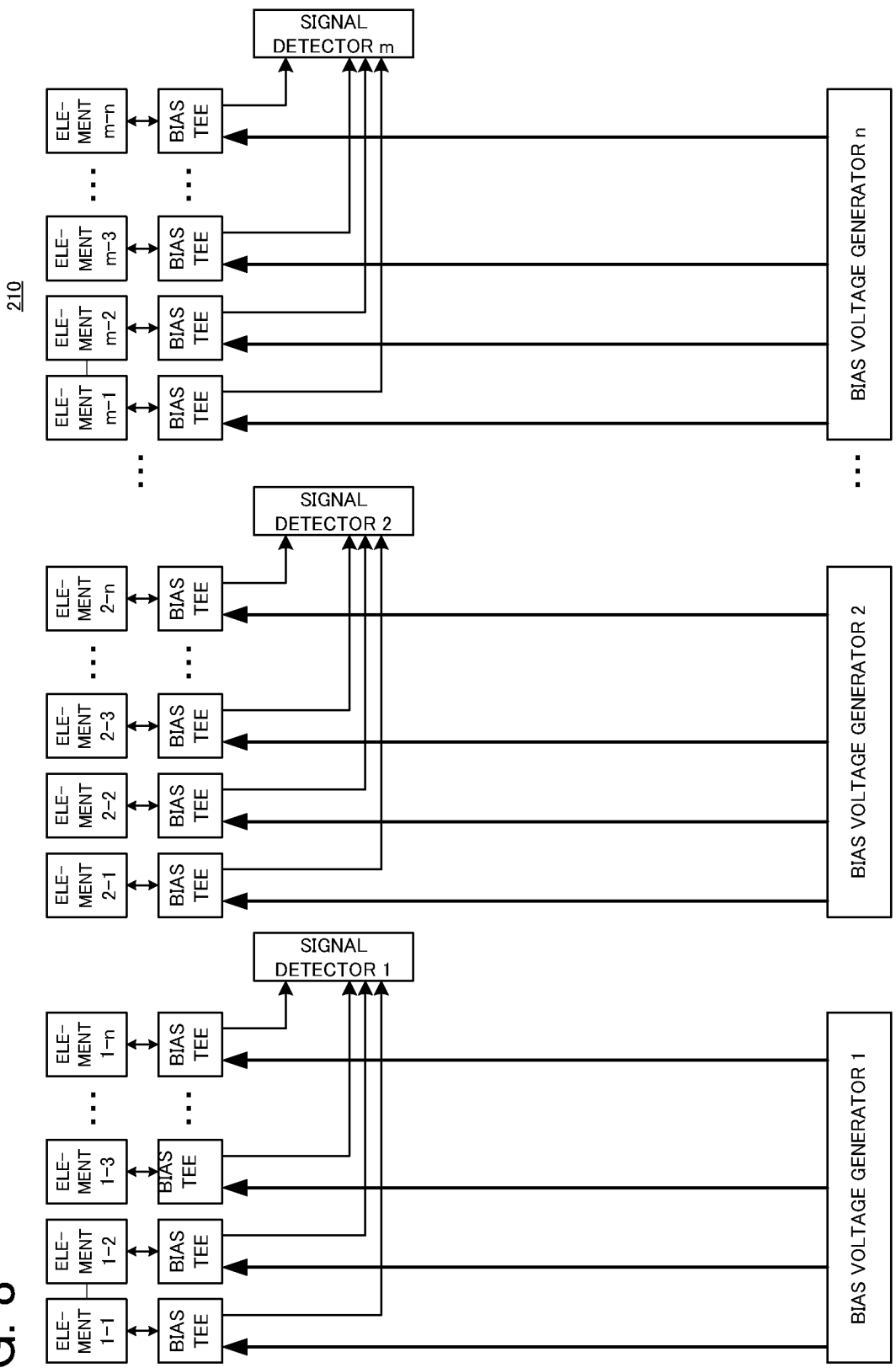
FIG. 8 is a block diagram illustrating a configuration of a terahertz wave detecting apparatus according to a second modified example of the second practical example.

Not only the circuit configuration of the terahertz wave detecting apparatus 200 illustrated in FIG. 5 but also a circuit configuration of a terahertz wave detecting apparatus 210 illustrated in FIG. 8 may be used. Even in this case, as long as the bias voltage is not outputted from two or more bias voltage generators at the same time, it is possible to significantly reduce the consumption current of the terahertz wave detecting apparatus 210.

The electromagnetic wave detecting apparatus according to the present invention can be applied not only to the terahertz wave, but also to, for example, millimeter wave detection.

The present invention is not limited to the aforementioned embodiments and examples, but various changes may be made, if desired, without departing from the essence or spirit of the invention which can be read from the claims and the entire specification. An electromagnetic wave detecting apparatus and a method of setting acquisition timing of a detection signal that involve such changes are also intended to be within the technical scope of the present invention.

DESCRIPTION OF REFERENCE NUMERALS AND LETTERS 11 bias voltage generator
12 ... signal processor/controller
21 bias voltage generation unit
100, 200, 210 bias voltage detecting apparatus

The invention claimed is:

1. An electromagnetic wave detecting apparatus comprising:
   a plurality of detecting devices each of which is configured to detect an electromagnetic wave;
   a voltage applying device configured to apply bias voltage to each of said plurality of detecting devices;
   an obtaining device configured to obtain a detection signal outputted from each of said plurality of detecting devices; and
   a setting device configured to set acquisition timing of the detection signal for each of said plurality of detecting devices, on the basis of the bias voltage, which is applied to each of said plurality of detecting devices, and the detection signal of each of said plurality of detecting devices.

2. The electromagnetic wave detecting apparatus according to claim 1, wherein
   said voltage applying device is a single voltage applying device, and
   said plurality of detecting devices are connected to said voltage applying device electrically in parallel to each other.

3. The electromagnetic wave detecting apparatus according to claim 1, wherein said voltage applying device is configured to apply the bias voltage in a first period, to each of detecting devices in a first group, out of said plurality of detecting devices, and is configured to apply the bias voltage in a second period, which is different from the first period, to each of detecting devices in a second group, which is different from the first group, out of said plurality of detecting devices.

4. The electromagnetic wave detecting apparatus according to claim 3, wherein
   said voltage applying device is configured to periodically switch between on and off of the bias voltage, and
   said voltage applying device is configured to sequentially increase a voltage value of the bias voltage within a range from a first voltage to a second voltage, which is higher than the first voltage, every time the bias voltage is switched from off to on, and is configured to switch the bias voltage from on to off when the voltage value reaches the second voltage, and is configured to set the voltage value at the first voltage next time the bias voltage is switched from off to on.

5. The electromagnetic wave detecting apparatus according to claim 1, wherein said voltage applying device is configured to periodically change a voltage value of the bias voltage.

6. The electromagnetic wave detecting apparatus according to claim 5, wherein said setting device is configured to set the acquisition timing of the detection signal for each of said plurality of detecting devices, within one period of the voltage value, which is periodically changed.

7. The electromagnetic wave detecting apparatus according to claim 6, wherein the acquisition timing of the detection signal is a time at which a bias voltage that allows a maximum detection sensitivity, or a bias voltage that is lower by a predetermined voltage than the bias voltage that allows the maximum detection sensitivity, is applied to a corresponding detecting device.

8. The electromagnetic wave detecting apparatus according to claim 1, comprising a storing device configured to store the acquisition timing of the detection signal for each of said plurality of detecting devices.

9. The electromagnetic wave detecting apparatus according to claim 1, wherein each of said plurality of detecting devices includes an element having nonlinearity in current-voltage characteristics.

10. The electromagnetic wave detecting apparatus according to claim 9, wherein the element is a resonant tunneling diode.

11. A method of setting acquisition timing of a detection signal in an electromagnetic wave detecting apparatus including: a plurality of detecting devices each of which is configured to detect an electromagnetic wave; a voltage applying device configured to apply bias voltage to each of the plurality of detecting devices; and an obtaining device configured to obtain a detection signal outputted from each of the plurality of detecting devices, said method comprising:

a setting process of setting the acquisition timing of the detection signal for each of the plurality of detecting devices, on the basis of the bias voltage, which is applied to each of the plurality of detecting devices, and the detection signal of each of the plurality of detecting devices.

* * * * *